United States Patent
Bandic et al.

(10) Patent No.: US 10,290,350 B2
(45) Date of Patent: May 14, 2019

(54) OVERLAPPING WRITE SCHEMES FOR CROSS-POINT NON-VOLATILE MEMORY DEVICES

(71) Applicant: Western Digital Technologies, Inc., Irvine, CA (US)

(72) Inventors: Zvonimir Z. Bandic, San Jose, CA (US); Won Ho Choi, San Jose, CA (US); Jay Kumar, Saratoga, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/899,615

(22) Filed: Feb. 20, 2018

(65) Prior Publication Data
US 2018/0197607 A1    Jul. 12, 2018

Related U.S. Application Data

(63) Continuation of application No. 15/403,800, filed on Jan. 11, 2017, now Pat. No. 9,911,494.

(51) Int. Cl.
    *G11C 11/00*    (2006.01)
    *G11C 13/00*    (2006.01)

(52) U.S. Cl.
    CPC ...... *G11C 13/0069* (2013.01); *G11C 13/0097* (2013.01)

(58) Field of Classification Search
    CPC ............ G11C 13/0069; G11C 11/5628; G11C 11/5635; G11C 13/0004; G11C 13/0035;
    (Continued)

(56) References Cited

U.S. PATENT DOCUMENTS 7,755,935 B2    7/2010  Lam et al.
8,909,849 B2   12/2014  Sundaram et al.
(Continued)

FOREIGN PATENT DOCUMENTS

CN      102741935 A     10/2012
CN      103366806 A     10/2013
KR    20160085976 A      7/2016

OTHER PUBLICATIONS

Chen et al., "Impact of Vertical RRAM Device Characteristics on 3D Cross-point Array Design", IEEE 2014, 4 pgs. Applicant points out, in accordance with MPEP 609.04(a), that the year of publication, 2014, is sufficiently earlier than the effective U.S. filing date, Jan. 11, 2017, so that the particular month of publication is not in issue.

Khan et al., "Multi-Bit Read and Write Methodologies for Diode-STTRAM Crossbar Array", 2016, 6 pgs. Applicant points out, in accordance with MPEP 609.04(a), that the year of publication, 2016, is sufficiently earlier than the effective U.S. filing date, Jan. 11, 2017, so that the particular month of publication is not in issue.

(Continued)

*Primary Examiner* — Thong Q Le
(74) *Attorney, Agent, or Firm* — Arent Fox LLP

(57) ABSTRACT

A first write operation is received. The first write operation includes a SET operation. The SET operation is configured to place a cell of the non-volatile memory (NVM) device in a relatively low-resistance state. A second write operation is received. A first electrical pulse is applied to a first cell of the NVM device. The first electrical pulse is applied to place the first cell in the relatively low-resistance state. A second electrical pulse is applied to a second cell of the NVM device. The second electrical pulse is applied before the first electrical pulse has concluded. The second cell and the first cell are both within a single tile of the NVM device.

20 Claims, 5 Drawing Sheets

(58) Field of Classification Search
CPC .......... G11C 13/0064; G11C 13/0097; G11C 16/0483; G11C 16/3422; G11C 16/349; G11C 16/3495
USPC .......... 365/185.03, 185.18, 185.24, 185.29
See application file for complete search history.

(56) References Cited

U.S. PATENT DOCUMENTS

| | | | |
|---|---|---|---|
| 8,953,387 B2 | 2/2015 | Castro | |
| 9,159,412 B1 | 10/2015 | Hung et al. | |
| 9,349,450 B2 | 5/2016 | Otsuka et al. | |
| 2009/0034324 A1 | 2/2009 | Kim et al. | |
| 2016/0018988 A1 | 1/2016 | Guyot et al. | |
| 2016/0103627 A1 | 4/2016 | Barkley et al. | |
| 2016/0118136 A1* | 4/2016 | Tseng .............. | G11C 16/3495 365/185.03 |
| 2017/0032838 A1 | 2/2017 | Park et al. | |

OTHER PUBLICATIONS

Kim et al., "Improving Write Performance by Controlling Target Resistance Distributions in MLC PRAM", ACM Transactions on Design Automation of Electronic Systems, vol. 21, No. 2, Article 23, Jan. 2016, 27 pgs.

Li et al., "A three-stage-write scheme with flip-bit for PCM main memory", IEEE 2015, 6 pgs. Applicant points out, in accordance with MPEP 609.04(a), that the year of publication, 2015, is sufficiently earlier than the effective U.S. filing date, Jan. 11, 2017, so that the particular month of publication is not in issue.

Non-Final Office Action on U.S. Appl. No. 15/403,800 dated May 2, 2017.

Notice of Allowance on U.S. Appl. No. 15/403,800 dated Oct. 30, 2017.

Notification of the First Office Action dated Feb. 19, 2019, regarding Chinese Patent Application No. 201711399900.8 with English Translation.

* cited by examiner

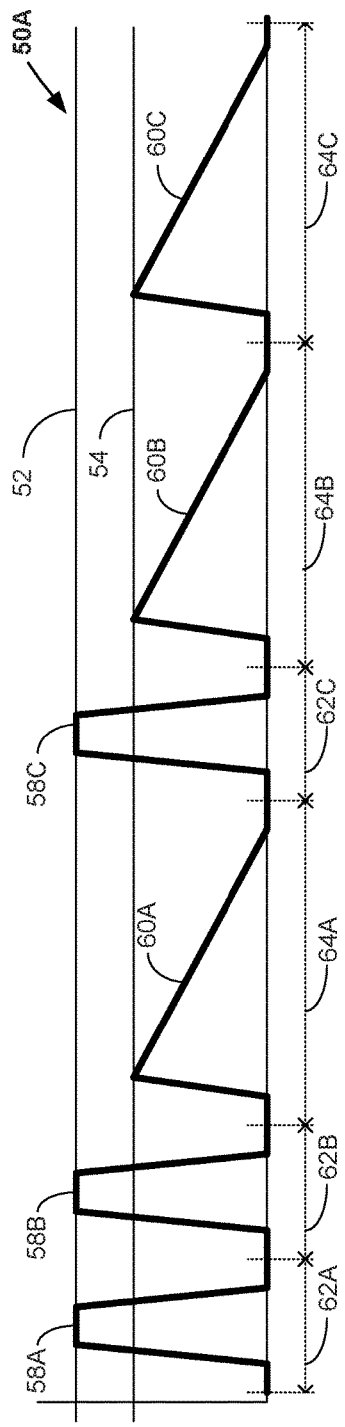
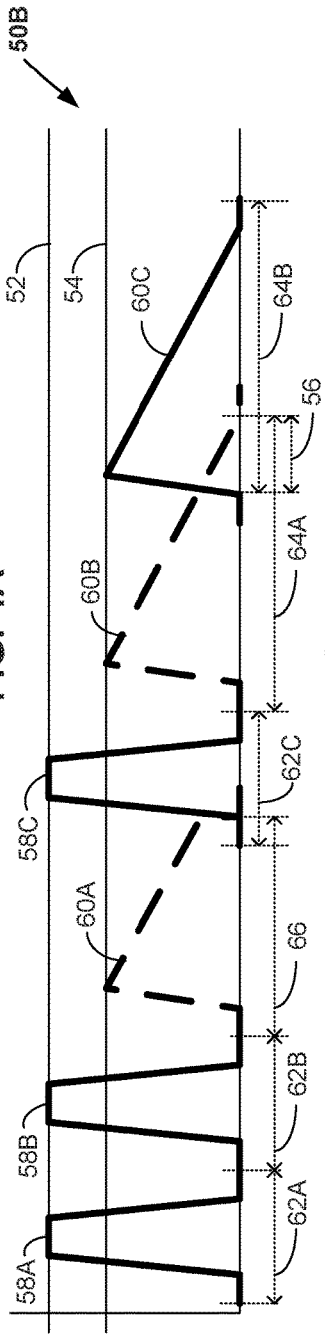
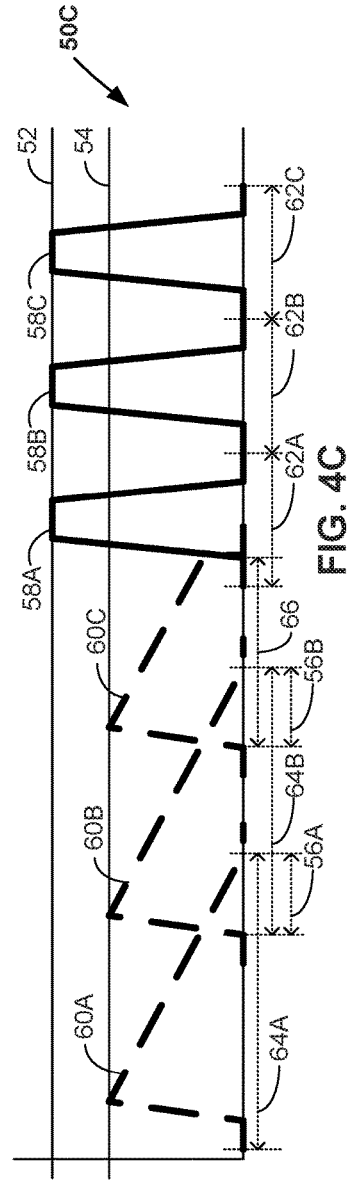

OVERLAPPING WRITE SCHEMES FOR CROSS-POINT NON-VOLATILE MEMORY DEVICES

CROSS REFERENCE TO RELATED APPLICATIONS

This application is a continuation application of U.S. patent application Ser. No. 15/403,800, filed on Jan. 11, 2017, the entirety of which is incorporated by reference herein.

TECHNICAL FIELD

The disclosure generally relates to solid state storage devices, and more particularly, to cross-point non-volatile memory devices.

BACKGROUND

Solid State Devices (SSDs) may utilize non-volatile memory (NVM) devices, such as flash memory, phase change memory (PCM), resistive random access memory (ReRAM), magneto-resistive random access memory (MRAM), programmable metalization cell (PMC, otherwise known as conductive-bridging random access memory, or CBRAM®), or the like. Some of these devices, such as PCM and ReRAM, utilize forms of cross-point memory architecture. Cross-point memory architecture can include the use of memristors. Memristor technology may store data based on the electrical resistance of respective memristors. Memristors may change between a high-resistance state and a low-resistance state based on an amount and direction of electrical current to which the memristor was most recently exposed. Write operations to devices with cross-point memory architecture may include setting or altering the electrical resistance state of the respective components that hold such resistance states.

SUMMARY

In some examples, a method includes receiving a first write operation. The first write operation includes a SET operation. The SET operation is configured to place a cell of the non-volatile memory (NVM) device in a relatively low-resistance state. A second write operation is received. A first electrical pulse is applied to a first cell of the NVM device. The first electrical pulse is applied to place the first cell in the relatively low-resistance state. A second electrical pulse is applied to a second cell of the NVM device. The second electrical pulse is applied before the first electrical pulse has concluded. The second cell and the first cell are both within a single tile of the NVM device.

In some examples, a system includes a NVM device. The NVM device is configured to receive a first write operation. The first write operation includes a SET operation configured to place a cell of the NVM device in a relatively low-resistance state. The NVM device is configured to receive a second write operation. The NVM device is configured to apply a first electrical pulse to a first cell of the NVM device. The first electrical pulse places the first cell of the NVM device in the relatively low-resistance state. The NVM device is configured to apply a second electrical pulse to a second cell of the NVM device before the first electrical pulse has concluded. A single tile of the NVM device includes the first cell and the second cell.

In some examples, a storage device includes an interface, a NVM device, a power supply, and a controller. The controller may be configured to receive a first write operation from the interface. The first write operation comprises a SET operation configured to place a cell of the NVM device in a relatively low-resistance state. The controller may be further configured to receive a second write operation from the interface. The controller may be further configured to apply a first electrical pulse of the power supply to a first cell of the NVM device to place the first cell in the relatively low-resistance state. The controller may be further configured to apply a second electrical pulse of the power supply to a second cell of the NVM device before the first electrical pulse has concluded. A single tile of the NVM device includes the first cell and the second cell.

The details of one or more examples are set forth in the accompanying drawings and the description below. Other features, objects, and advantages will be apparent from the description and drawings, and from the claims.

BRIEF DESCRIPTION OF DRAWINGS

FIGS. 4A-4C depict charts of example electrical pulses over time according to various techniques for executing write operations to a NVM device, in accordance with one or more techniques of this disclosure.

DETAILED DESCRIPTION

Figure 1:
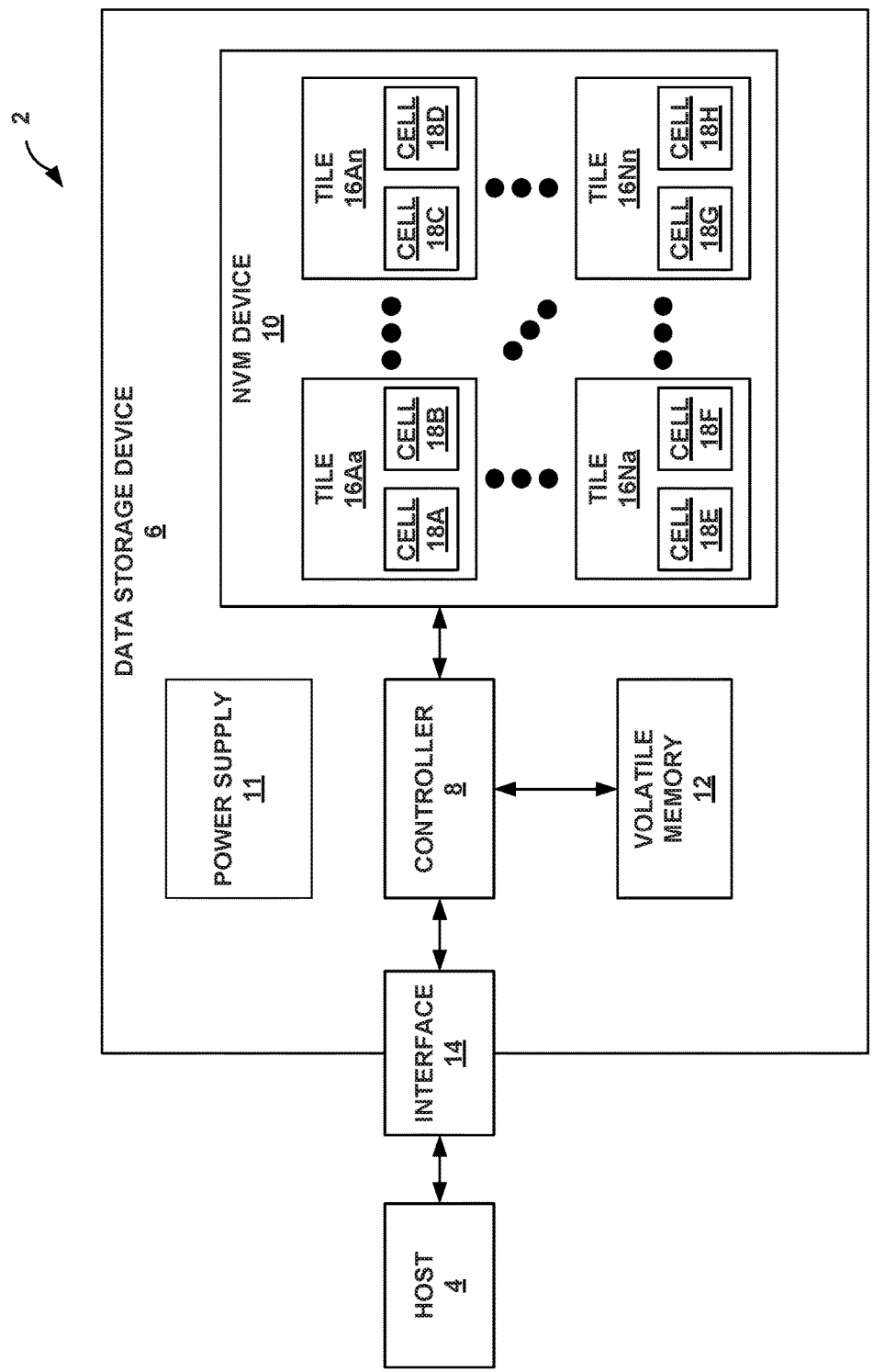
FIG. 1 is a conceptual and schematic block diagram illustrating an example storage environment in which a non-volatile memory (NVM) device may function as a NVM device for a host device, in accordance with one or more techniques of this disclosure.

In general, this disclosure describes techniques for managing write operations at a non-volatile memory (NVM) device, such as in a solid-state drive (SSD). For example, the NVM device may include phase change memory (PCM) or resistive random access memory (ReRAM). The NVM device may employ cross-point memory architecture. The NVM device may receive multiple write operations, e.g., at least two write operations. The NVM device may perform each write operation by applying a respective electrical pulse to a respective memory cell of the NVM device. The NVM device may determine to perform the two write operations to two memory cells within a single tile of the NVM device. The NVM device may be divided into tiles such that a power supply is configured to be able to execute a write operation to each tile in parallel (e.g., with simultaneous writes), but the power supply may not be configured to be able to execute two (or more) write operations within a single tile in parallel. In some examples, tiles may be a set of physically proximate cells.

The NVM device may execute a write operation comprising a SET operation that uses an electrical pulse of a first amount of current ($I_{SET}$) to place a cell in the relatively low-resistance state. The NVM device also may execute a second write operation comprising a RESET operation that uses an electrical pulse of a second amount of current ($I_{RESET}$). In some examples, the amplitude of $I_{RESET}$ may be approximately 20% greater than the amplitude of $I_{SET}$. The RESET operation may place a respective cell in the relatively high-resistance state.

Aspects of the current disclosure relate to overlapping and optionally reordering write operations for a NVM device that utilizes cross-point memory architecture. The NVM device may receive at least a first write operation and a second write operation. The first write operation may include a SET operation. The NVM device is configured to apply a first electrical pulse to a first cell of the NVM device to complete the first write operation. The NVM device then may apply a second electrical pulse to a second cell of the NVM device for the second write operation before the first electrical pulse has concluded. The first cell and the second cell are both in a single tile of the NVM device. Applying a second pulse before a first pulse has concluded may result in performance benefits as write operations may be executed relatively faster compared to write operations that are performed sequentially with no overlap.

In some examples, if the second write operation includes a RESET operation, the NVM device may apply the second pulse to the second cell when the current of the first electrical pulse decays to a predetermined amount. In certain examples, the predetermined amount may be approximately 20% of $I_{RESET}$. The NVM device may determine when the current of the first pulse decays to a predetermined amount by measuring the current of the first pulse or by timing the duration of the first pulse (e.g., in such situations where current decay is predictable). Additionally, in some examples, if the second write operation includes a RESET operation, the first pulse may be terminated when the second pulse is applied.

If the second write operation includes a SET operation, the second pulse may be applied when the current used to execute the first write operation has decayed a predetermined amount. The predetermined amount may be 80%. The NVM device may determine when the current decays to the predetermined amount by measuring the current of the first pulse or by timing the duration of the first pulse. The first pulse may continue decaying (e.g., in contrast to being terminated) while the NVM device applies the second pulse, or may be terminate when the NVM device applies the second pulse. In this way, a NVM device may overlap the execution of the first write operation with the execution of the second write operation (therein resulting in performance benefits) without surpassing a maximum amount of current a given tile or NVM device can provide at a given point in time.

In some examples, the NVM device may receive a plurality of write operations that include both RESET and SET operations. In some such examples, the NVM device may reorder the plurality of write operations prior to performing the write operations. For example, the NVM device may reorder the write operations such that SET operations are before RESET operations (e.g., all SET operations in a set of write operations are before any RESET operation in the set of write operations). The application of electrical pulses for the reordered plurality of write operations may overlap as described herein. Reordering write operations to execute SET operations before RESET operations may results in performance benefits as a NVM device can reduce more time from the process of executing write operations, since the NVM device may overlap either SET or RESET operations over the end of a SET operation, but may not overlap commands with an end of a RESET command.

FIG. 1 is a conceptual and schematic block diagram illustrating an example storage environment 2 in which storage device 6 may overlap and optionally reorder write operations from host device 4, in accordance with one or more techniques of this disclosure. For instance, host device 4 may store data to and/or retrieve data from one or more storage devices 6. In some examples, storage environment 2 may include a plurality of storage devices, such as storage device 6, which may operate as a storage array. For instance, storage environment 2 may include a plurality of storages devices 6 configured as a redundant array of inexpensive/independent disks (RAID) that collectively function as a mass storage device for host device 4.

Host device 4 may include any computing device, including, for example, a computer server, a network attached storage (NAS) unit, a desktop computer, a notebook (e.g., laptop) computer, a tablet computer, a set-top box, a mobile computing device such as a "smart" phone, a television, a camera, a display device, a digital media player, a video gaming console, a video streaming device, or the like. Typically, host device 4 includes any device having a processor, which may refer to any form of hardware capable of processing data and may include a general-purpose processing unit, such as a central processing unit (CPU), dedicated hardware (such as an application specific integrated circuit (ASIC)), configurable hardware such as a field programmable gate array (FPGA) or any other form of processing unit configured by way of software instructions, microcode, firmware or the like.

As illustrated in FIG. 1, storage device 6 may include a controller 8, a non-volatile memory device 10, a power supply 11, volatile memory 12, and an interface 14. In some examples, storage device 6 may include additional components not shown in FIG. 1 for sake of clarity. For example, storage device 6 may include a printed circuit board (PCB) to which components of storage device 6 are mechanically attached and which include electrically conductive traces that electrically interconnect components of storage device 6, or the like. In some examples, the physical dimensions and connector configurations of storage device 6 may conform to one or more standard form factors. Some example standard form factors include, but are not limited to, 3.5" data storage device (e.g., an HDD or SSD), 2.5" data storage device, 1.8" data storage device, peripheral component interconnect (PCI®), PCI-extended (PCI-X®), PCI Express (PCIe®) (e.g., PCIe® x1, x4, x8, x16, PCIe® Mini Card, MiniPCI®, etc.), M.2, or the like. In some examples, storage device 6 may be directly coupled (e.g., directly soldered) to a motherboard of host device 4.

Storage device 6 may include an interface 14 for interfacing with host device 4. Interface 14 may include one or both of a data bus for exchanging data with host device 4 and a control bus for exchanging commands with host device 4. Interface 14 may operate in accordance with any suitable protocol. For example: advanced technology attachment (ATA) (e.g., serial-ATA (SATA) and parallel-ATA (PATA)), Fibre Channel, small computer system interface (SCSI), serially attached SCSI (SAS), peripheral component interconnect (PCI), PCI-express, or Non-Volatile Memory Express (NVMe). The electrical connection of interface 14 (e.g., the data bus, the control bus, or both) is electrically connected to controller 8, providing electrical connection between host device 4 and controller 8, allowing data to be exchanged between host device 4 and controller 8.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like.

Storage device 6 also may include volatile memory 12, which may be used by controller 8 to store information. In some examples, controller 8 may use volatile memory 12 as a cache. For instance, controller 8 may store cached information in volatile memory 12 until the cached information is written to non-volatile memory cells 16 of non-volatile memory device 10. Volatile memory 12 may consume power received from power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Storage device 6 includes at least one NVM device 10, only one of which is shown in FIG. 1 for purposes of illustration only. NVM device 10 may include a plurality of cells 18A-18H (collectively, "cells 18") across a plurality of tiles 16Aa-16Nn (collectively, "tiles 16"). Cells 18 may be employed in cross-point memory architecture to store data. NVM device 10 may be configured to store relatively large amounts of data (e.g., 128 MB, 512 MB, 1 GB, 4 GB, 16 GB, 64 GB, 128 GB, 512 GB, 1 TB, etc.). In some examples, NVM device 10 may be one of a plurality of NVM devices of the data storage device 6. In such examples, NVM devices 10 may all have the same capacity or NVM devices may have different capacities.

In certain examples, some cells 18 of NVM device 10 may utilize other forms of memory (e.g., rather than exclusively utilizing cross-point memory architecture). For example, some portion of NVM device 10 may include flash memory devices (e.g., NAND or NOR), ferroelectric random-access memory (FRAM), holographic memory devices, and any other type of non-volatile memory devices. In some examples, PCM, ReRAM, MRAM, and FRAM devices may have better endurance than flash memory devices. In other words, PCM, ReRAM, MRAM, and FRAM devices may be capable of performing more read and/or write operations before wearing out compared to flash memory devices.

Storage device 6 includes controller 8, which may manage one or more operations of storage device 6. For instance, controller 8 may manage the reading of data from and/or the writing of data to NVM device 10. Controller 8 may represent one of or a combination of one or more of a microprocessor, digital signal processor (DSP), application specific integrated circuit (ASIC), field programmable gate array (FPGA), or other digital logic circuitry.

In accordance with some techniques of this disclosure, controller 8 may determine when and how to overlap write operations, as described herein. In such examples, controller 8 may monitor electrical pulses of write operations to determine when to terminate or begin a following electrical pulse. Further, in some examples, controller 8 may reorder write operations within a set of write operations such that write operations of a respective tile 16 that include SET operations are executed before write operations of the respective tile 16 that include RESET operations. In these examples, NVM device 10 may not perform these functions, but may instead only store the tiles 16 and cells 18 upon which the functions are executed.

In other examples, NVM device 10 may determine when and how to overlap write operations, or NVM device 10 may perform some of these functions while controller 8 performs other functions. For example, NVM device 10 may determine tile 16 sizes based on the voltage drop at a point in time, while controller 8 manages overlapping and reordering functions. Therefore, though NVM device 10 is described throughout the disclosure as making the relevant determinations when managing overlap schemes for purposes of clarity, it is to be understood that it is contemplated and consistent with this disclosure for controller 8 to be making some or all of these determinations.

NVM device 10 may utilize PCM or ReRAM technology, and may alter the electrical resistive state of cells 18 within a tile 16 to store data. It is to be understood that tiles 16 do not need to be predetermined physical portions of NVM device 10, although tiles 16 may be predetermined physical portions of NVM device 10 in some examples. Instead, tiles 16 may be the smallest allotment of cells 18 within which an electrical pulse of a write operation may be applied while allowing a neighboring tile 16 to simultaneously apply an electrical pulse to a respective cell 18 within the neighboring tile 16 at a point in time.

Each cell 18 of a tile 16 may share at least one bitline or wordline with one other cell 18 of the tile 16. In some examples, circuitry of storage device 6 may be configured to deliver no more than a maximum amount of current to a tile 16 at a given time. This maximum amount of current may be $I_{RESET}$. In certain examples, this maximum current may be insufficient to execute two write operations at once within a tile 16. For example, if the maximum amount of current is $I_{RESET}$, the circuitry of storage device 6 (e.g., circuitry of power supply 11 of storage device 6), may not be configured to perform two write operations within the tile 16 at the same time, as the two write operations in conjunction require more current than the maximum of which the circuitry is configured to provide.

It is to be understood that tiles 16 are depicted with two cells 18 for purposes of clarity, and that each tile of tiles 16 may include any number of cells 18. The allotment of cells 18 within a tile 16 may be determined by analyzing the current requirements and voltage drop of write operations across cells 18 within a tile 16. For example, tile 16Aa may be sized to allow neighboring tiles 16Ab and 16Ba (not shown) to execute write operations in parallel with tile 16Aa. NVM device 10 may determine tile 16 size based on $I_{RESET}$, as $I_{RESET}$ is greater than $I_{SET}$ (e.g., it takes more current to put a memristor of a cell in a relatively high-resistance RESET state than the amount of current it takes to put a memristor of a cell in a relatively low-resistance SET state). Therefore, in some examples, a tile 16 may be defined by as the smallest subdivision of cells to which power supply 11 may supply $I_{RESET}$ while simultaneously providing $I_{RESET}$ to one or more neighboring tiles 16. As such, in some examples the size of tiles 16 (e.g., the number of cells 18 within a tile 16) may change over time if $I_{RESET}$ decreases. In some examples, each tile 16 of NVM device 10 includes the same number of cells 18.

In accordance with the techniques of this disclosure, NVM device 10 may receive two write operations from controller 8, a first write operation and a second write operation. The write operations may ultimately originate from host 4 through interface 14, or may originate from controller 8. The first and second write operations may be received from controller 8 within the given period of time, such that the first and second write operations are placed in a write queue and are in the queue at the same time. Even in examples in which controller 8 does not manage overlap schemes, controller 8 may still perform some functions in executing the write operations. For example, controller 8 may convert the write requests from a first format used by host 4 to a second format used by NVM device 10, controller 8 may identify respective cells 18 and/or tiles 16 at which the write requests will be executed, or the like.

The first write operation may include a SET operation to apply a first electrical pulse to put cell 18A in a relatively low-resistance state. In some examples, NVM device 10 may identify that the first write operation is for cell 18A. In other examples, controller 8 or NVM device 10 may assign the write request to cell 18A for electrical current reasons (e.g., assigning write requests to specific cells 18 to increase a number of write requests that may be concurrently executed given voltage drop across portions of bitlines and/or wordlines). In other examples, controller 8 or NVM device 10 may assign the write request for NVM device 10 longevity reasons (e.g., alternating the location of writes to avoid impairing some cells 18 by a relatively high number of writes). In other examples, NVM device 10 may randomly or pseudo randomly assign the write request to cell 18A.

Cell 18A is in tile 16Aa. In some examples, if the second write request is not to be executed in tile 16Aa, NVM device 10 may execute the first write request without a following overlapping write request. Put differently, in some examples, NVM device 10 may only overlap the electrical pulse of a write request including a SET operation with a second electrical pulse of a second write request if the second write request is received before the first request is fully executed (e.g., before the first electrical pulse is fully decayed).

NVM device 10 may identify that the first write operation includes a SET operation. NVM device 10 may identify that the first write operation includes a SET operation by identifying that the write operation includes putting a respective cell in a "one" logical state, where a "zero" logical state correlates to a SET operation and a "one" logical state correlates to a RESET operation. In other examples, the logical states of SET and RESET operations may be switched, such that a SET operation includes putting a respective cell in a "one" logical state and a RESET operation includes putting a respective cell in a "zero" logical state. NVM device 10 may define whether a SET or RESET operation is a "zero" or "one" logical state, respectively, by the configuration of input buffers and output buffers (not depicted) of NVM device 10. In other examples, NVM device 10 may identify that the first write request includes a SET operation by a flag or indicator within the first write request.

In some examples, NVM device 10 may identify that the first write operation includes a SET operation as part of a standing process to identify the nature (e.g., SET operation or RESET operation) of every incoming write operation. In other examples, NVM device 10 may only identify whether write operations include SET or RESET operations in response to a prompt from controller 8, or in instances of high volume (e.g., where a backlog of write requests exceeds a predetermined threshold number of write requests) or high urgency (e.g., when an incoming batch job of write requests includes a flag that indicates that the batch job must be executed within an amount of a time that satisfies a predetermined threshold).

The second write operation may include applying a second electrical pulse to a cell in tile 16Aa, such as cells 18B. Being as cells 18A and 18B are in the same tile 16Aa, NVM device 10 may not be configured to provide sufficient current (e.g., may not be able to draw enough current from power supply 11) to apply the first and electrical pulses entirely in parallel. However, in response to identifying that the first write operation includes a SET operation, NVM device 10 may apply the second electrical pulse to cell 18B before the first electrical pulse is concluded at cell 18A. In some examples, both write operations may be received before an electrical pulse of the first write operation is instantiated. In these examples, NVM device 10 may apply the first electrical pulse to cell 18A having identified that a second electrical pulse will overlap the first electrical pulse. In other examples, the second write operation may be received as the first write operation is being executed. In these examples, NVM device 10 may overlap the first electrical pulse to cell 18A with a second electrical pulse for 18B "on the fly." Further, in some of these examples, the first electrical pulse may overlap the second electrical pulse relatively less, based upon the amount of time between the first electrical pulse being instantiated and the second write operation being received and processed by NVM device 10.

In some examples, NVM device 10 may identify that the second write operation includes a RESET operation. Further, NVM device 10 may identify that the RESET operation is to be executed at a cell in the same tile 16Aa as the cell 18A of the first write operation, such as cell 18B. The second write operation may be executed at cell 18B for any of the reasons discussed herein. In response to identifying that the second write operation includes a RESET operation in the same tile 16Aa as the first memory operation, NVM device 10 may apply the second pulse when the current of the first electrical pulse decays to a predetermined percentage of the $I_{RESET}$ for the second pulse, such as 20%. NVM device 10 may identify when the current of the first pulse decays to the predetermined percentage of the $I_{RESET}$ by measuring the current of the first pulse. NVM device 10 may measure the current of the first pulse with current-measuring circuitry (not depicted). Alternatively, NVM device 10 may determine when the current of the first pulse decays to the predetermined percentage of the $I_{RESET}$ by timing the duration of the first pulse (e.g., in such situations where current decay is substantially stable and substantially predictable). NVM device 10 may time the duration of the first pulse with clock or timing circuitry (not depicted). Additionally, in some examples in which the second write operation includes a RESET operation, NVM device 10 may terminate the first pulse when the second pulse is applied, as described in more detail in FIGS. 4B-4C. Terminating the first pulse may include NVM device 10 stopping the flow of current for the first pulse in a substantially instantaneous stoppage.

In some examples, NVM device 10 may identify that the second write operation includes a SET operation. Further, NVM device 10 may identify that the SET operation is to be executed at a cell in the same tile 16Aa as the cell 18A of the first write operation, such as cell 18B. The second write operation may be executed at cell 18B for any of the reasons discussed herein. In response to identifying that the second write operation includes a SET operation in the same tile 16Aa as the first write operation, NVM device 10 may apply the second electrical pulse to cell 18B when a current of the first electrical pulse has decayed a predetermined amount, such as 80%. NVM device 10 may determine when the current decays the predetermined amount 80% by measuring the current of the first pulse or by timing the duration of the first pulse, as described above. The first pulse for cell 18A may continue decaying (e.g., in contrast to being terminated) while the second pulse for cell 18B is applied, or NVM device 10 may terminate the first pulse when NVM device 10 initiates the second pulse for cell 18B.

In some examples, if NVM device 10 identifies that a first write operation includes a RESET operation, NVM device 10 may not store this identification. Instead, NVM device 10 may simply execute the first write request without overlapping the first request with a second write request, after which NVM device 10 may identify whether or not the second write operation includes a SET operation so as to overlap the second write operation with a potential third write operation.

It is to be understood that describing a "first" and "second" write operation does not necessarily indicate that the "first" write operation is literally the initial write operation of a set of write operations (e.g., the initial write operation of a received batch job, or the first write operation ever received from host 4, or the first write operation received after turning on/instantiating data storage device 6 or NVM device 10). Instead, a "first" write operation, as used herein, is any write operation that has been executed (e.g., the associated electrical pulse has not fully decayed) at a tile before a next (e.g., "second") write operation is received that will be executed at the same tile. For example, the first write operation could be the nth write operation to be written to a tile of a pseudo-continuous stream of incoming write operations, as long as the second write operation as used herein is a write operation to be written to said tile that is received (and therein analyzed and identified as a possible overlapping write operation) prior to the first write operation being completed. For another example, the first write operation could be the $5^{th}$ write operation that will be written to a tile of an ordered list of write operations received from host 4, as long as the second write operation is the $6^{th}$ write operation of the ordered list that will be written to the tile.

In some examples, NVM device 10 may optionally reorder write operations. For example, NVM device 10 may reorder write requests when there is a plurality of backlogged write requests (e.g., write requests that have been received and identified by NVM device 10 but not yet executed onto cells 18 of NVM device 10) that include both SET and RESET operations that will be executed at a tile where some RESET operations are ordered before some SET operations. Alternatively, NVM device 10 may only reorder write requests in response to an instruction from controller 8, or in instances of high volume or high urgency as described above.

For example, NVM device 10 may receive a plurality of write operations from controller 8. NVM device 10 may identify that a subset of the received plurality of write operations will be written to tile 16Nn, for example. Upon identifying this, NVM device 10 may further identify that some write operations of the subset of write operations include RESET operations that, the received subset, are ordered before SET operations. NVM device 10 may reorder the subset of write operations such that NVM device 10 executes all SET operations in the subset of write operations before executing any RESET operations for tile 16Nn. Upon reordering, NVM device 10 may execute the subset of write operations to tile 16Nn in the overlapping fashion described herein. In some examples, NVM device 10 may concurrently reorder other subsets of the plurality of write operations for other tiles 16. In these examples, NVM device 10 may concurrently execute each reordered subset of write operations across respective tiles 16, where write operations are executed in overlapping fashion as described herein within each tile 16.

Figure 2:
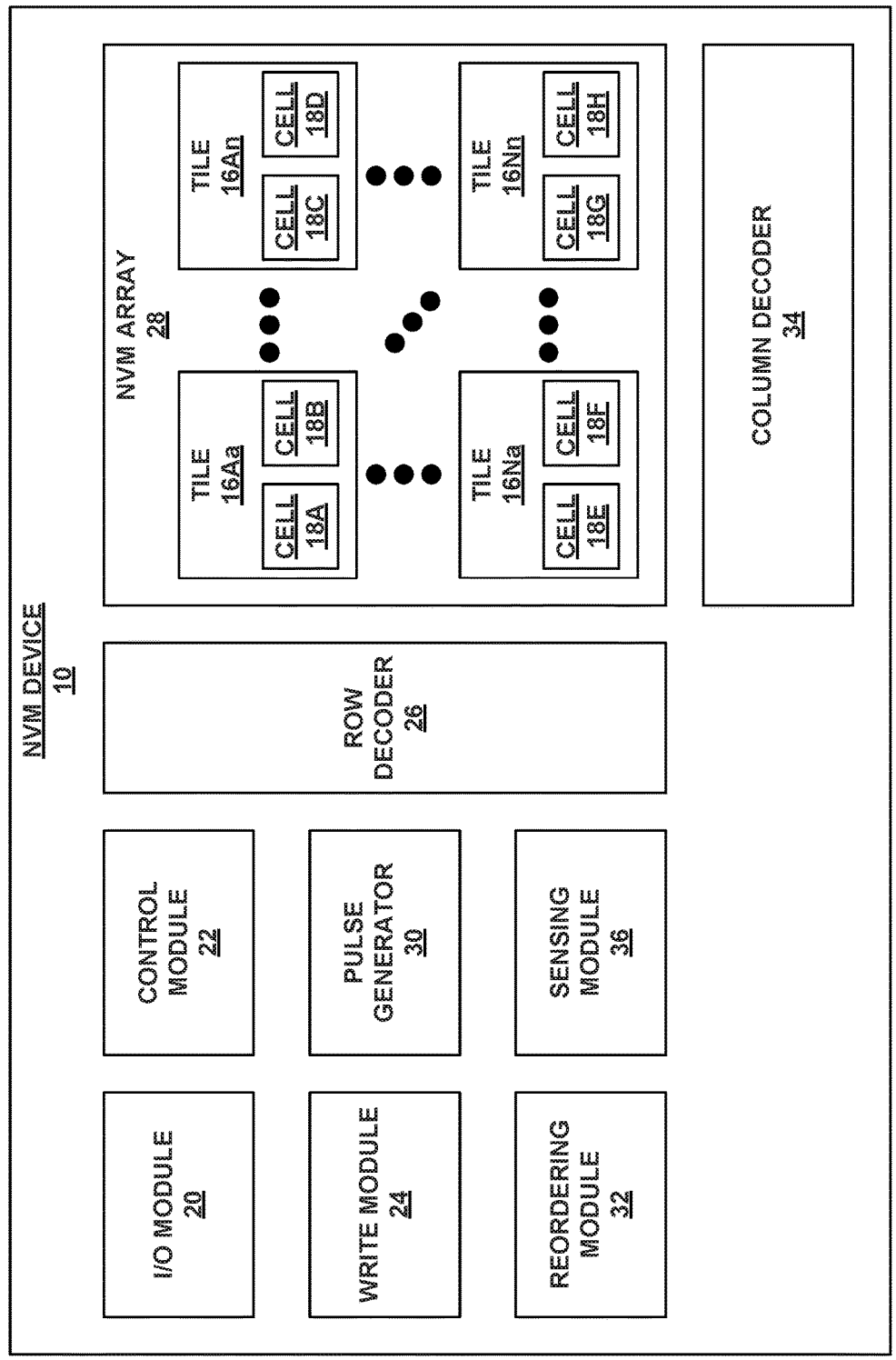
FIG. 2 is a conceptual and schematic block diagram illustrating example components of a NVM device, in accordance with one or more techniques of this disclosure.

FIG. 2 is a conceptual and schematic block diagram illustrating example components of NVM device 10, in accordance with one or more techniques of this disclosure. NVM device 10 may include I/O module 20, control module 22, write module 24, row decoder 26, NVM array 28, pulse generator 30, reordering module 32, column decoder 34, and sensing module 36, as shown in FIG. 2. In some examples, NVM device 10 may include more or fewer components than those shown in FIG. 2, or functions attributed to multiple modules shown in FIG. 2 may be implemented in a single module. Each of the modules illustrated in and described with respect to FIG. 2 may be implemented in hardware, firmware, software, or combinations thereof, and different modules may be implemented differently. NVM array 28 may include tiles 16 and cells 18 as described above.

NVM device 10 is illustrated as including control module 22 and reordering module 32, and control module 22 and reordering module 32 are described as performing techniques of this disclosure. As discussed above, in alternate examples, some or all the functions attributed to control module 22, reordering module 32, or both, discussed herein may instead be performed by controller 8 of data storage device 6 (FIG. 1). Although examples below predominantly discuss determinations made in the context of a single tile 16 for purposes of clarity, it is to be understood that control module 22 may make such determinations for a plurality of tiles 16 sequentially or concurrently. For example, control module 22 may be configured to manage overlapping techniques, reordering techniques, or both, discussed herein for all or most tiles 16 of NVM array 28 at the same time, such that control module 22 is managing a separate queue of write operations for each tile 16.

Controller 8 may send a plurality of write operations to NVM device 10 that are received by I/O module 20. In some examples, I/O module 20 may convert information of the plurality of write operations from a first format used by host 4 or controller 8 to a second format used by NVM device 10. I/O module 20 may organize incoming write operations into one or more queues. The one or more queues may be pseudo-constantly updated as new write operations are received by I/O module 20 and control module 22 manages the execution of queued write operations.

Write module 24 may manage one or more aspects of writing data to NVM array 28. For example, write module 24 may write data to NVM array 28 by selecting one or more cells 18 of a tile 16 within NVM array 28 to store the data of the write operations as described herein. Write module 24 may therein direct and define an electric pulse created by pulse generator 30 to the selected cells 18 using row decoder 26 and column decoder 34. Write module 24 may define an electrical pulse by specifying a current or voltage of an electrical pulse and specifying whether or not the electrical pulse will be terminated as described herein. Row decoder 26 and column decoder 34 may route an electrical pulse to the selected cells 18 so that a single cell 18 of a given row and column is accessed per electrical pulse. Directing an electric pulse to the selected cells 18 may alter an electrical resistance state of the selected cells 18, storing the data of the write operation for the selected cell.

For example, write module 24 may execute a write operation that includes a SET operation. Write module 24 may determine that the write operation is to be written to cell

18A. A memristor of cell 18A may initially be in an amorphous state with relatively high electrical resistance to store a value of logical one. Write module 24 may control pulse generator 30 to generate an electrical pulse with a maximum current of $I_{SET}$. Row decoder 26 and column decoder 34 may direct the electrical pulse to the selected cell, e.g., cell 18A, such that memristor of cell 18A becomes crystalline with relatively low electrical resistance to store a value of logical zero.

As another example, write module 24 may execute a write operation that includes a RESET operation. Write module 24 may determine that the write operation is to be written to cell 18B. A memristor of cell 18B may initially be in a crystalline state with relatively low electrical resistance to store a value of a logical zero. Write module 24 may control pulse generator 30 to generate an electrical pulse with a maximum current of $I_{RESET}$. Row decoder 26 and column decoder 34 may direct the electrical pulse to the selected cell, e.g., cell 18B, such that the memristor of cell 18B becomes amorphous with relatively high electrical resistance to store a value of logical one.

Pulse generator 30 may generate electrical pulses to alter the resistive state of cells 18 of NVM array 28. An as example, PCM may be NVM device 10. The resistive state of cells 18 may be changed in response to a PCM of a respective cell experiencing either $I_{SET}$ or $I_{RESET}$, changing the phase of the PCM from crystalline or amorphous or vice versa. After an electrical pulse is applied such that either $I_{SET}$ or $I_{RESET}$ is applied, in some examples the current is allowed to decay to zero before a next electrical pulse is applied. In some examples, an initial period of decay may impact the resistive state of cells 18 until a temperature of the cells falls below a threshold temperature. Below the threshold temperature, phase transformation and growth may substantially stop, such that a resistive state of the cells 18 is set. After this initial period of decay (e.g., once the temperature of the cells falls below the threshold temperature), in some examples the decaying current of an electrical pulse may be terminated rather than allowed to decay to zero without impacting the phase of the respective cell 18. Pulse generator 30 may draw current from power supply 11 of data storage device 6. In some examples, pulse generator 30 and/or power supply 11 are configured to apply a maximum amount of current (e.g., $I_{RESET}$) at a given time to a given tile 16. In some such examples, pulse generator 30 and/or power supply 11 may not be configured to provide sufficient current for write module 24 to execute two write operations to a given tile 16 at a given time. In other examples, control module 22 may configure tiles 16 such that pulse generator 30 and/or power supply 11, as configured, are not able to provide concurrent pulses of more than the maximum amount of current to a given tile 16 at a given time. For example, in some instances, pulse generator 30 and/or power supply 11 may be configured to provide a maximum amount of current that is, for example, thirty times greater than $I_{RESET}$ to the NVM array 28. In such instances, control module 22 may configure NVM array 28 to include thirty tiles 16 that are equally populated by cells 18, such that the existing configuration of pulse generator 30 and/or power supply 11 may be sufficient to provide each of the thirty tiles 16 with a maximum current of $I_{RESET}$.

Control module 22 may detect that at least one of a received plurality of write operations that are to be written to a tile 16 includes a SET operation. Control module 22 may determine that the plurality of write operations include a SET operation by analyzing contents of each write operation received from controller 8. Alternatively, control module 22 may detect a SET operation by detecting a flag indicating a SET operation within a first write operation of the plurality of write operations. In response to detecting a SET operation within the first write operation, control module 22 may control write module 24 to initiate a second, subsequent write operation to a cell 18 of the same tile 16 before the first write operation has concluded.

For example, if a write operation that follows the first write operation and is to be performed on a cell of the same tile as the first write operation includes a SET operation, control module 22 may instruct write module 24 to apply an electrical pulse for the second write operation after a the current of the electrical pulse for the first write operation has decayed a predetermined percentage of the maximum amplitude of the electrical pulse. For example, after a SET operation, control module 22 may instruct write module 24 to apply the electrical pulse of the second write operation after the current of the electrical pulse of the first write operation decays 80% (e.g., such that the current is at 20% of $I_{SET}$). In other examples, control module 22 may instruct write module 24 to apply an electrical pulse of the second write operations at a different predetermined percentage. In some examples, pulse generator 30 and/or power supply 11 may be configured to provide a maximum current of more than $I_{RESET}$ to a tile 16. Where pulse generator 30 and/or power supply may be configured to provide more current to a tile than $I_{RESET}$, control module 22 may set or identify the predetermined percentage to a higher amount, such as, for example, 20% of $I_{SET}$ (e.g., as a given tile 16 has more electrical current resources to draw from). Control module 22 may detect that the current of the first write operation decays to the predetermined percentage using sensing module 36 or sensing module 36 may sense an amount of current of an electrical pulse at a first cell 18.

In other examples, control module 22 may detect that the second write operation includes a RESET operation. In response to detecting that the second write operation includes a RESET operation, control module 22 may control write module 24 apply the electrical pulse of the second write operation once the current of the electrical pulse of the first write operation decays to a predetermined percentage. In some examples, the predetermined amount may be 20% of the maximum current of the second write operation (e.g., 20% of $I_{RESET}$). In other examples, the predetermined may be different amounts, due to different configurations of pulse generator 30, power supply 11, and/or tiles 16 of NVM array 28. The predetermined percentage may be the same for SET and RESET operations, or may be different.

In some examples, control module 22 may determine whether to reorder the plurality of write operations. Control module 22 may determine to reorder the plurality of write operations for any one or more of a number of reasons, such as a detected number of write operations to be written to a given tile 16 satisfying a threshold, detecting a user input instructing data storage device 6 to implement write operation reordering, detecting an urgency of the plurality of write requests (e.g., when an incoming batch job of write requests includes a flag that indicates that the batch job must be executed within an amount of a time that satisfies a predetermined threshold), or the like. Control module 22 may control reordering module 32 to reorder write operations of the plurality of write operations.

Reordering module 32 may reorder write operations of the plurality of write operations such that some or all of the SET operations are ordered before some or all of the RESET operations. If reordering module determines that the plurality of write operations are to be written to cells 18 of many tiles 16, reordering module 32 may reorder write operations for all tiles 16 on a tile-by-tile basis, such that all tiles 16 have a new order of write operation to be written where most or all of the SET operations are ordered and therein executed before most or all of the RESET operations.

Reordering write operations may include reordering module 32 modifying a queue of write operations for a tile 16. The queue may have a plurality of write operations in an order as received from host 4 and/or controller 8 that are to be written to the tile 16. The queue may include both SET operations and RESET operations, where some RESET operations are ordered before SET operations and/or between SET operations. Reordering module 32 may reorder write operations of the queue such that all or most SET operations are before any RESET operations. By reordering write operations of a queue, reordering module 32 may increase write throughput of NVM device 10 by increasing opportunities to overlap write operations, therein decreasing an amount of time between the execution of write operations.

Figure 3:
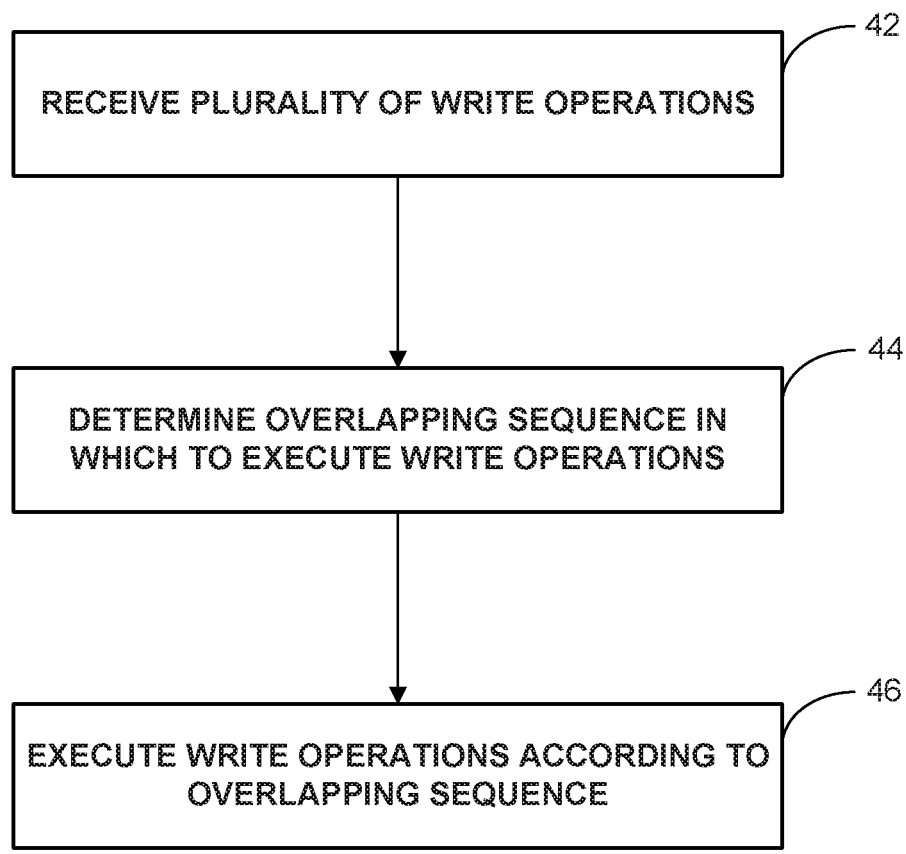
FIG. 3 is a flow diagram illustrating an example technique for executing write operations to a NVM device, in accordance with one or more techniques of this disclosure.

FIG. 3 is a flow diagram illustrating an example technique for executing write operations to NVM device 10, in accordance with one or more techniques of this disclosure. In some examples, NVM device 10 may be configured to overlap and reorder write operations when possible. For example, it may be possible to overlap write operations when a queue includes a write operation that follows a write operation with a SET operation. Further, it may be possible to overlap write operations when there is more than one write operation in a queue and some of the write operations of the queue include SET operations while other write operations of the queue include RESET operations. In other examples, the technique of FIG. 3 may begin by determining whether to overlap and reorder write operations. Controller 8 (FIG. 1) or control module 22 may determine whether to overlap and reorder write operations, though the technique of FIG. 3 is described with reference to control module 22 of FIG. 2 for purposes of clarity.

Control module 22 may access a log or table to determine user or system preferences for whether to overlap and reorder write operations. For example, a table may indicate that system settings (e.g., settings of data storage device 6) include overlapping write operations for NVM device 10 in response to a queue including, on average, more than ten write operations to be written to respective tiles 16 over a period of time (e.g., over a minute). Alternatively, a table may indicate to overlap write operations, reorder write operations, or both, in response to a received batch job having a size that meets or exceeds a threshold size (e.g., in terms of number of write operations in the batch). In other examples, data storage device 6 may be configured to always overlap write operations as described herein, and only reorder write operations in certain situations.

The technique of FIG. 3 may include receiving, by control module 22, a plurality of write operations (42). For example, the plurality of write operations may be received from host 4 by interface 14 of data storage device 6. Controller 8 may then receive the plurality of write operations from interface 14 and transmit the plurality of write operations to I/O module 20 of NVM device 10. Control module 22 may receive the plurality of write operations from I/O module 20. In some examples, the plurality of write operations are to be written at a plurality of tiles 16. In other examples, the plurality of write operations are all to be written at a single tile of tiles 16, or control module 22 may assign all of the write operations to a single tile of tiles 16. Regardless, control module 22 may determine that at least a first write operation and a second write operation of the plurality of write operations are to be written at a single tile of tiles 16. Control module 22 may also determine that at least one write operation of the write operations that are to be written at a single tile includes a SET operation.

Control module 22 then may optionally determine an overlapping sequence for executing the plurality of write operations (44). Control module 22 may determine the overlapping sequence in response to determining that at least a first write operation and a second write operation are to be written to a single tile 16, and at least one of the first and second write operations includes a SET operation. In some examples, control module 22 may also determine the overlapping sequence in response to determining that a write operation follows the SET operation. If no write operation is ordered after the SET operation, then in some examples (e.g., examples where control module 22 does not reorder the write operations with reordering module 32) control module 22 may not determine an overlapping sequence, as there is no write operation after the SET operation with which an end of the SET operation may overlap.

The overlapping sequence may include the order in which write operations were received, respective to a specific tile 16. For example, if ten write operations are received, control module 22 may determine that the first two write operations are to be written at cells 18 of a first tile of tiles 16, the next five write operations are to be written at cells 18 of a second tile of tiles 16, and the last three write operations are to be written at cells 18 of the first tile of tiles 16. In this way, control module 22 may control write module 24 execute write operations to the first tile of tiles 16 in an order of write operation 1, 2, 8, 9, 10. Further, in this example, control module 22 may control write module 24 execute write operations to the second tile 16 in an order of write operation 3, 4, 5, 6, 7. As an example, control module 22 may determine that write operations 2, 4, 5, 6, and 10 include SET operations. In response to this determination, control module 22 may determine to cause write operation 8 to overlap with write operation 2 at the first tile of tiles 16 and cause write operations 5, 6, and 7 to overlap with write operations 4, 5, and 6, respectively, at the second tile of tiles 16.

In other examples, control module 22 may be configured to reorder the write operations. For example, control module 22 may determine that some write operations (e.g., write operations 2, 8, and 9 at the first tile of tiles 16) that include RESET operations are before write operations that include SET operations in the sequence of write operations received by control module 22. In response to this determination, control module 22 may control reordering module 32 to reorder the write operations such that most or all of the SET operations are before any of the RESET operations. For example, control module 22 may control reordering module 32 to reorder write operations at the first tile of tiles 16 to an order of 2, 10, 4, 5, 6, and control module 22 may likewise control reordering module 32 to reorder write operations at the second tile of tiles 16 to an order of 4, 5, 6, 3, 7. Other methods of reordering to organize SET operations before RESET operations are also possible.

Control module 22 then may cause the write operations to be performed in the overlapping sequence (46). For example, control module 22 may cause write module 24 to perform the write operations to cells 18 of a first tile of tiles 16 of NVM device 10 using pulse generator 30. Control module 22 may cause write module 24 to start applying electrical pulses for write operations that follow SET operations before the preceding electrical pulse has concluded.

For example, if, for a selected tile of tiles 16, a write operation that follows a SET operation itself includes another SET operation, write module 24 may apply the electrical pulse of the following write operation when the pulse of the preceding write operation decays to a first predetermined amount, such as to 20% of $I_{SET}$. As another example, if, for a selected tile of tiles 16, a write operation that follows a SET operation includes a RESET operation, write module 24 may reduce current consumption of the first electrical pulse before the second electrical pulse is applied. In some such examples, write module 24 may cause the first electrical pulse to be terminated and the second electrical pulse to be applied in response to the first electrical pulse decaying to a second predetermined amount, such as to 20% of $I_{RESET}$. In some examples, write module 24 may reduce current consumption of the first electrical pulse before applying the second electrical pulse as a result of the second electrical pulse requiring all or substantially all of the current that pulse generator 30 and/or power supply 11 is configured to supply to the given tile of tiles 16.

By organizing NVM device 10 into tiles 16 that have a maximum current of $I_{RESET}$ and then reordering and/or overlapping write operations of certain tiles 16 according to the method of FIG. 3, control module 22 may provide performance benefits to NVM device 10 when executing write operations. Specifically, write module 24 may be able to execute a series of write operations in relatively less time as a result of control module 22 identifying when write operations can be overlapped and therein causing write module 24 to overlap in a manner that does not negatively impact the integrity of write operations (e.g., by waiting until a current of a first electrical pulse decays to a predetermined amount). NVM device 10 may further see faster write times as a result of reordering module 32 reordering write operations to increase opportunities for overlapping. By decreasing an amount of time it may take to execute write operations to a tile according to the method of FIG. 3, control module may also increase an amount of write operations that may be written to a tile in a set amount of time.

As an example, PCM may be NVM device 10. FIGS. 4A-4C depict charts 50A-50C (collectively "charts 50") of example electrical pulses over time according to various techniques for executing write operations to PCM as NVM device 10 in accordance this disclosure. A "y" axis of charts 50 relates to current amplitude that defines depicted electrical pulses, and an "x" axis of charts 50 relates to time. Put differently, charts 50 depict the electrical current of example electrical pulses over time. Charts 50 depict RESET electrical pulses 58A-C (collectively "RESET electrical pulses 58") and SET electrical pulses 60A-C (collectively "SET electrical pulses 60") over time. SET electrical pulses that are overlapped by write module 24 are indicated in charts 50 with dashed lines. In some examples, write module 24 may terminate overlapped SET electrical pulses (e.g., rather than decaying to a substantially zero current). RESET electrical pulses 58 and SET electrical pulses 60 may be applied to cells 18 of a single tile 16 by pulse generator 30 as controlled by write module 24 and managed by control module 22. In some examples, write module 24 provides electrical pulse specifications and cell 16 locations to pulse generator 30 such that pulse generator 30 creates respective electrical pulses for respective cells 18, Charts 50 depict the execution of a substantially similar set of write operations that were received by NVM device 10. The set of write operations may be substantially similar in that each set of write operations includes three SET operations and three RESET operations. In some examples, each of the three sets of write operations were received with the write operations in a first order. In some such examples, the order may include a first write operation that includes a RESET operation (e.g., a RESET operation to apply pulse 58A), a second write operation that includes a RESET operation (e.g., a RESET operation to apply pulse 58B), a third write operation that includes a SET operation (e.g., a SET operation to apply pulse 60A), a fourth write operation that includes a RESET operation (e.g., a RESET operation to apply pulse 58C), a fifth write operation that includes a SET operation (e.g., a SET operation to apply pulse 60B), and a sixth write operation that includes a SET operation (e.g., a SET operation to apply pulse 60C).

FIG. 4A depicts a chart 50A of the execution of example electrical pulses 58, 60. As depicted in chart 50A, executed write operations do not overlap and are not reordered. Example electrical pulses 58, 60 may be generated by pulse generator 30 to the specifications of write module 24 as managed by control module 22. As depicted in chart 50A, write operations that include RESET operations may complete in a first period of time 62A-C (collectively "period of time 62"). The period of time 62 for RESET operations to complete may include the time for the RESET electrical pulse 58 to reach a maximum current $I_{RESET}$ 52 and thereinafter decay. Similarly, write operations that include a SET may complete in a second period of time 64A-C (collectively "period of time 64"). The period of time 64 for SET operations to complete may include the time it takes for the SET electrical pulse 60 to achieve maximum current $I_{SET}$ 54 and thereinafter decay. In some examples, RESET operations that are not overlapped may take 120 nanoseconds, while SET operations that are not overlapped take 520 nanoseconds. In such examples, all example electrical pulses 58, 60 of chart 50A may be applied by pulse generator 30 according to write module 24 in 1,920 nanoseconds.

FIG. 4B depicts a chart 50B of example electrical pulses 58, 60 applied to cells 18 of a single tile 16. Write operations of chart 50B partially overlap and are not reordered. Example electrical pulses 58, 60 may be generated by pulse generator 30 to the specifications of write module 24 as managed by control module 22. The write operations of chart 50B may have been received by NVM device (e.g., as sent from controller 8) in the same order as the write operations of chart 50A. Control module 22 may identify that the first two write operations (as identified above) relate to RESET operations and may therein cause write module 24 to execute electrical pulses 58A and 58B using pulse generator 30 without overlap.

Control module 22 may identify that the third write operation includes a SET operation and that the fourth write operation includes a RESET operation. In response, control module 22 may cause write module 24 to terminate third electrical pulse 60A for the third write operation after a period of time 66. Electrical pulse 60A may be terminated by write module 24 in order to free up sufficient resources (e.g., electrical current capacity) of pulse generator 30 and/or power supply 11 to supply $I_{RESET}$ for electrical pulse 58C (e.g., in examples where pulse generator 30 and/or power supply 11 is configured to provide a maximum current of $I_{RESET}$ to each tile 16). The period of time 66 may relate to the electrical pulse 60A of the third write operation decaying to a predetermined threshold amount, such as 20% of $I_{RESET}$ 52. Sensing module 36 may sense when the current of the third electrical pulse 60A decays to the predetermined threshold amount.

Write module 24 may use pulse generator 30 to instantiate electrical pulse 58C of the fourth write operation substantially immediately after the period of time 66. In some examples, write module 24 may cause pulse generator 30 to begin the fourth electrical pulse 58C in response to sensing module 36 sensing that the current of the third electrical pulse 60A decays to the predetermined threshold amount. In certain examples, the fourth electrical pulse 58C has a ramp-up period, such that the current of the fourth electrical pulse 58C does not rise immediately upon the fourth write operation being executed. In such examples, write module 24 may use pulse generator 30 to instantiate fourth electrical pulse 58C before the current of the third electrical pulse 60A decays to the predetermined amount. Instantiating the fourth electrical pulse 58C before the current of the third electrical pulse 60A decays to the predetermined amount may result in the current of the fourth electrical pulse 58C increasing as depicted upon the current of the third electrical pulse 60A decaying to the predetermined amount. In other words, in examples in which write module 24 must instantiate electrical pulses 58, 60 a period of time before a current of the respective electrical pulses 58, 60 can be applied/increased, write module 24 may use pulse generator 30 to instantiate the electrical pulses 58, 60 before the increase of current is desired, in order to ensure that the increase of current occurs when desired. Upon instantiation, pulse generator 30 may apply fourth electrical pulse 58C without overlapping third electrical pulse 58C. Control module 22 may determine to not overlap fourth electrical pulse 58C as fourth electrical pulse 58C is of a RESET operation.

In some examples, pulse generator 30 and/or power supply 11 may be configured to supply more current to a tile 16 than $I_{RESET}$. In such examples, pulse generator 30 may not terminate third electrical pulse 60A upon applying fourth electrical pulse 58C. For example, if pulse generator 30 and/or power supply 11 are configured to supply an amount of current to a tile 16 that is substantially equal to $I_{RESET}$+ 20% of $I_{SET}$, then pulse generator 30 may apply fourth electrical pulse 58C once the third electrical pulse 60A is at 20% of $I_{SET}$ without terminating third electrical pulse 60A (e.g., as pulse generator 30 can supply sufficient current for both as configured). Other examples with different tile 16/pulse generator 30/power supply 11/threshold amounts combinations are also possible.

Control module 22 may detect that both the fifth and the sixth write operations include SET operations as discussed above. As such, control module 22 may cause write module 24 to overlap electrical pulse 60B of the fifth write operation with electrical pulse 60C of the sixth write operation. Write module 24 may overlap fifth electrical pulse 60B once the current of fifth electrical pulse 60B is at or below a predetermined threshold amount. In some examples, this may be the same predetermined threshold amount as the predetermined threshold amount used by write module 24 when the following write operation includes a RESET operation. In other examples, the predetermined amount may be when the current of the preceding electrical pulse 60B decays to 20% of $I_{SET}$ 54. Sensing module 36 may detect when the current of electrical pulse 60B is at 20% of $I_{SET}$ 54. Write module 24 may allow fifth electrical pulse 60B to decay upon applying the sixth electrical pulse 60C (e.g., rather than terminating fifth electrical pulse 60 similar to the termination of electrical pulse 60A).

In certain examples, sixth electrical pulse 60C has a ramp-up period, such that write module 24 uses pulse generator 30 to instantiate sixth electrical pulse 60C before the current of fifth electrical pulse 60B decays to the predetermined amount. Write module 24 instantiating sixth electrical pulse 60C before the current of fifth electrical pulse 60B decays to the predetermined amount may allow the current of fourth electrical pulse 60C to increase as depicted once the current of fifth electrical pulse 60B decays to the predetermined amount.

As such, though write module 24 applies fifth electrical pulse 60B a "standard" period of time 64A and write module 24 applies sixth electrical pulse 60C over a substantially similar period of time 64B, an overlapping period of time 56 decreases the amount of time used to apply both electrical pulses 60B, 60C. However, as chart 50B ended with a SET operation, further chances for performance benefits may have been lost (e.g., as no electrical pulse overlapped sixth electrical pulse 60C, though it was possible to overlap sixth electrical pulse 60C due to it being for a SET operation). Combined with the earlier times 62A, 62B, 66, 62C, this may result in a final time of chart 50B of 1,680 nanoseconds, for example, demonstrating performance benefits of overlapping write operations in the form of faster times (e.g., in comparison to the non-overlapped write operations of chart 50A that concluded in 1,920 nanoseconds).

FIG. 4C depicts chart 50C of example electrical pulses 58, 60 at a single tile 16 for write operations that overlap and are reordered. Example electrical pulses 58, 60 may be generated by pulse generator 30 to the specifications of write module 24 as managed by control module 22. The write operations of chart 50C may have been received by NVM device 10 (e.g., as sent from controller 8) in the same order as the write operations of chart 50A and 50B. Control module 22 may identify that the first two write operations (as identified above) include RESET operations yet are ordered before a third write operation that includes a SET operation. Similarly, control module 22 may identify that the first write operation, the second write operation, and a fourth write operation that included a RESET operation are ordered before the fifth and sixth write operations that include SET operations. In response to control module 22 detecting that an initial queue order includes RESET operations between and before SET operations, reordering module 32 may reorder the write operations such that all write operations that include SET operations are before any write operations that include RESET operations. For example, reordering module 36 may reorder the plurality of write operations in the order of third original write operation, fifth original write operation, sixth original write operation, first original write operation, second original write operation, and fourth original write operation.

In other examples, reordering module 32 may reorder write operations in a different fashion. For example, reordering module 32 may reorder write operations such that the first write operation that includes a SET operation within an initial queue order is the last write operation that includes a SET operation within the reordered queue. For another example, reordering module 32 may reorder write operations such that the last write operation that includes a RESET operation within an initial queue order may be the first write operation that includes a RESET operation within a reordered queue. Other examples of reordering write operations are also possible such that all write operations that include SET operations are before any write operations that include RESET operations.

Write module 24 may execute a first (originally third) write operation with electrical pulse 60A generated by pulse generator 30. Upon detecting that the new order of write operations includes three write operations that include SET operations, control module 22 may cause the second (originally fifth) write operation to overlap the first write operation, and the third (originally sixth) write operation to overlap the second write operation. In this way, pulse generator 30 may apply the current of second electrical pulse 60B and third electrical pulse 60C once the current of first electrical pulse 60A and second electrical pulse 60B decay to the predetermined amount, respectively. As discussed herein, the predetermined amount may be a 20% decay of $I_{SET}$ 54 or another amount, depending upon the relative configurations of pulse generator 30, power supply 11, and/or tiles 16. Control module 22 may cause first electrical pulse 60A to overlap with second electrical pulse 60B for period of time 56A and second electrical pulse 60B to overlap with third electrical pulse 60C for period of time 56B.

Control module 22 may determine that the fourth, fifth, and sixth write operations of the reordered queue include RESET operations. In response to determining that the fourth write operation includes a RESET operation, control module 22 may cause write module 24 to prematurely terminate the current of third electrical pulse 60C. Write module 24 may terminate the current of third electrical pulse 60C in response to the current of third electrical pulse 60C decaying to a predetermined amount (e.g., 20% of $I_{RESET}$ 52). Further, write module 24 may apply fourth electrical pulse 58A of the fourth (originally first) write operation upon the current of third electrical pulse 60C decaying to the predetermined amount. Following fourth electrical pulse 58A of the fourth write operation, control module 22 may cause write module 24 to apply electrical pulses 58B, 58C of the fifth and sixth (originally second and fourth) write operations without overlapping, as these write operations include RESET operations. In this way, control module 22 reordering a queue to order all write operations with SET operations before any write operations with RESET operations may increase opportunities to overlap write operations and therein provide performance benefits in the forms of faster writes to data storage device 6. For example, pulses 60A-C, 58A-C of chart 50C may be executed in 1,560 nanoseconds, relatively faster than the overlapping but not reordered chart 50B.

Figure 5:
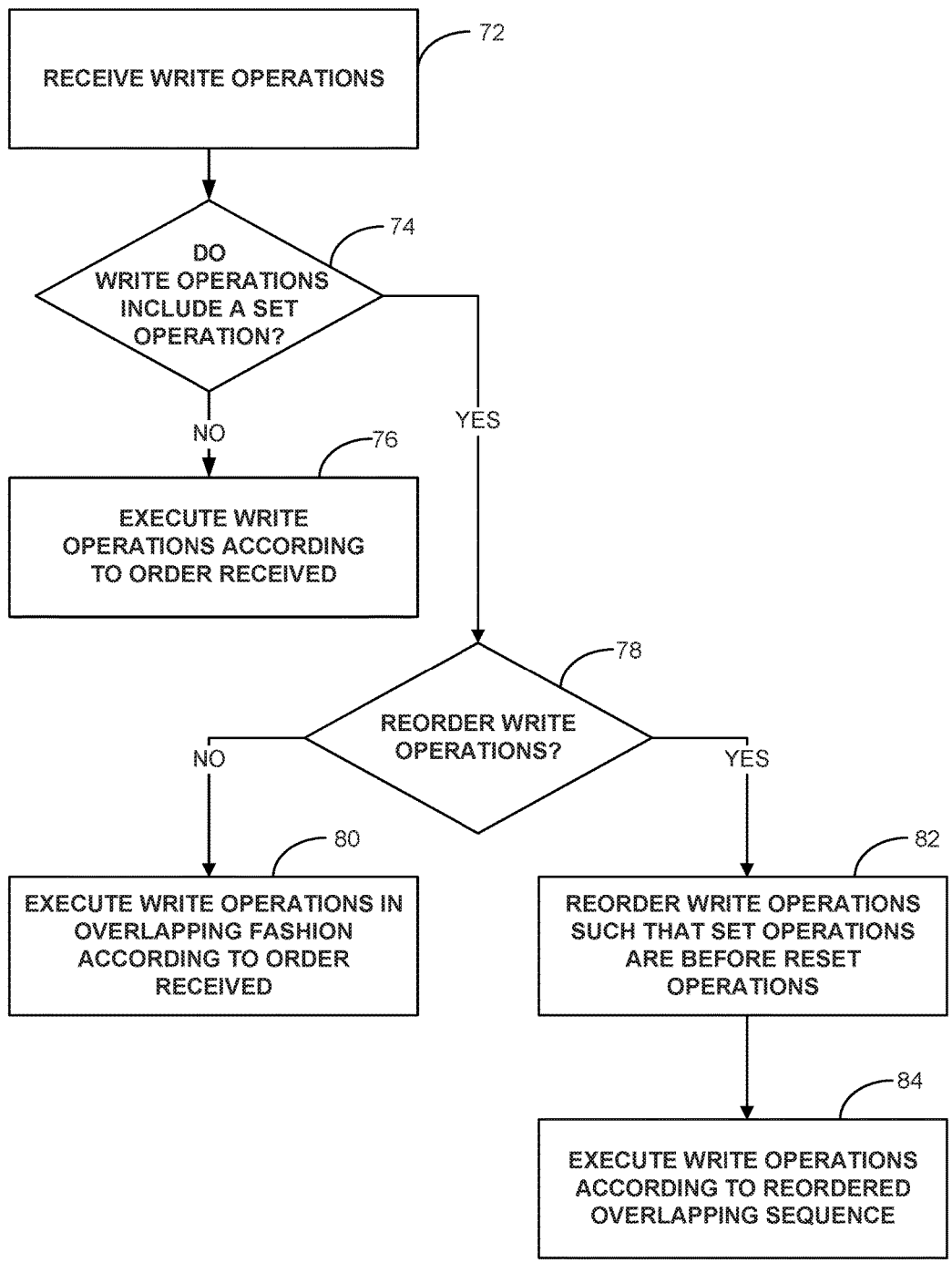
FIG. 5 is a flow diagram illustrating an example technique for executing write operations to a NVM device, in accordance with one or more techniques of this disclosure.

FIG. 5 is a flow diagram illustrating an example technique for executing write operations to NVM device 10, in accordance with one or more techniques of this disclosure. NVM device 10 may receive a plurality of write operations (72). Specifically, I/O module 20 of NVM device 10 may receive the plurality of write operations. The plurality of write operations may have originated with host 4, which sent the plurality of write operations to interface 14 to be analyzed and routed to NVM device 10 by controller 8. Control module 22 of NVM device 10 may determine that the plurality of write operations are to be written to a single tile 16 of NVM array 28 of NVM device 10.

Control module 22 determines whether or not the plurality of write operations includes at least one SET operation (74). In some examples, a control module 22 may further determine whether or not the plurality of write operations includes at least one SET operation that is ordered somewhere besides last in the queue (e.g., control module 22 may do this in situations where write operations will not be reordered). Control module 22 may determine whether the plurality of write operations includes a SET operation by analyzing contents of each write operation of the plurality of write operations. In other examples, a control module 22 may determine whether or not any write operations of the plurality of write operations includes a SET operation flag, where a SET operation flag indicates that the plurality of write operations has at least one write operation that includes a SET operation. A SET operation flag may be created by controller 8 or by host 4, among other options.

In some examples, the plurality of write operations may not include a SET operation ("NO" path of 74). In these examples, control module 22 may cause write module 24 to execute the plurality of write operations according to the order in which the plurality of write operations were received by I/O module 20 (76). In examples where the plurality of write operations were received simultaneously in an ordered queue, write module 24 may execute the write operations in the order of the ordered queue. In examples where the plurality of write operations were received simultaneously without an ordered queue, write module 24 may execute the write operations in substantially any order as determined by control module 22. In certain examples where reordering module 32 is not utilized, a plurality of write operations may include a single write operation with a SET operation, but this single write operation may be ordered as the last operation of the plurality. In such examples, control module 22 may still determine that plurality of write operations does not include a SET operation for purposes of this example method ("NO" path of 74) and therein execute write operations according to the order received (76), as a last write operation may not be used for overlapping.

In some examples, control module 22 may determine that the plurality of write operations includes at least one SET operation ("YES" path of 74). In these examples, control module 22 may determine whether or not to reorder the plurality of write operations (78). Control module 22 may determine whether or not to reorder the plurality of write operations based on a number of criteria. For example, control module 22 may evaluate whether or not reordering the plurality of write operations may result in notable performance benefits. In some examples (e.g., where the plurality of write operations includes five write operations, where the middle three include SET operations) control module 22 may evaluate the queue and determine that the resource costs of reordering the queue (e.g., as a result of using reordering module 32) do not substantially outweigh the resource savings of executing a reordered queue. In other examples, control module 22 may determine whether or not to reorder the plurality of write operations based on user input, a detected length of the plurality of write operations, or a detected urgency of the plurality of write operations as described herein.

In some examples, control module 22 may determine to not reorder the plurality of write operations ("NO" path of 78). In response to control module 22 determining to not reorder the plurality of write operations, write module 24 may execute the plurality of write operations in an overlapping fashion as described herein (80). Write module 24 may execute the plurality of write operations according to the order in which the plurality of write operations were received. In examples where the plurality of write operations were received simultaneously in an ordered queue, write module 24 may execute the plurality of write operations according to the ordered queue. Write module 24 may execute the plurality of write operations with electrical pulses using pulse generator 30 as described herein.

In some examples, control module 22 may determine to reorder the plurality of write operations ("YES" path of 78). Control module 22 may cause reordering module 32 to reorder the plurality such that substantially all write operations that include SET operations are ordered before substantially any write operations that include RESET operations (82). In certain examples, reordering module 32 may leave one or more write operations that include RESET operations at the beginning of a reordered queue of write operations. In such examples, reordering module 32 may reorder the plurality of write operations such that no write operation that includes a RESET operation is between any two write operations that both include a SET operation (e.g., even if the two write operations that both include SET operations are far apart in the queue, such as a fifth and tenth write operation that are separated by four write operations that include RESET operations, for one example).

Write module 24 may execute the plurality of write operations according to the reordered queue in an overlapping manner (84). Write module 24 may utilize pulse generator 30 to execute the plurality of write operations to cells 18 of a tile 16 of NVM device 10. The reordered queue of write operations may predominantly include a series of write operations with SET operations followed by a series of write operations with RESET operations. Write module 24 may overlap electrical pulses of the series of write operations with SET operations by applying the electrical pulse of SET operations once the pulse of the preceding write operation decays to 20% of $I_{SET}$, as discussed herein. For the last write operation within the reordered queue that includes a SET operation before the series of RESET operations, write module 24 may terminate the electrical pulse of the last SET operation and apply the electrical pulse of the first RESET operation once the current of the SET electrical pulse decays to 20% of $I_{RESET}$, as discussed herein. Write module 24 may then execute the following RESET operations without overlapping.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A method comprising:
   receiving, by a control module of a storage device, a plurality of write operations for writing to a non-volatile memory device of the storage device, wherein the non-volatile memory device comprises a plurality of groups of memory cells;
   determining, by the control module, a subset of the plurality of write operations to be written to a first group of the plurality of groups of memory cells; and
   reordering, by the control module, the subset for executing SET operations in the subset before executing RESET operations in the subset.

2. The method of claim 1, further comprising:
   determining, by the control module, that the subset comprises the SET operations; and
   determining, by the control module, that at least one of the SET operations is ordered for execution after at least one of the RESET operations in the subset.

3. The method of claim 1, further comprising:
   applying, by the control module, a first electrical pulse to a first memory cell of the first group for executing a first SET operation of the subset; and
   applying, by the control module, a second electrical pulse to a second memory cell of the first group for executing a second operation of the subset, wherein the second operation is either a second SET operation or a first RESET operation.

4. The method of claim 3, wherein the second electrical pulse is applied upon a current of the first electrical pulse decaying by a predetermined percentage.

5. The method of claim 3, wherein the second operation comprises the second SET operation, and wherein the second electrical pulse is applied upon a current of the first electrical pulse decaying by eighty percent.

6. The method of claim 3, wherein the second operation comprises the first RESET operation, and wherein the second electrical pulse is applied upon a current of the first electrical pulse decaying to twenty percent of a maximum current of the second electrical pulse.

7. The method of claim 6, further comprising terminating the first electrical pulse upon applying the second electrical pulse.

8. The method of claim 1, wherein executing the SET operations comprises placing the memory cells being programmed with the SET operations in a low-resistance state.

9. The method of claim 1, wherein executing the RESET operations comprises placing the memory cells being programmed with the RESET operations in a high-resistance state.

10. A method comprising:
receiving, by a control module of a storage device, a plurality of write operations for writing to a non-volatile memory device of the storage device, wherein the non-volatile memory device comprises a plurality of tiles and each of the plurality of tiles comprises memory cells;
determining, by the control module, an overlapping sequence of the plurality of write operations, wherein the overlapping sequence is based at least upon the plurality of write operations being written to a first tile of the plurality of tiles and at least one of the plurality of write operations being a SET operation; and
executing, by the control module, the plurality of write operations based upon the overlapping sequence, wherein the executing comprises applying a first electrical pulse for the SET operation and applying a second electrical pulse for a next operation following the SET operation, wherein the second electrical pulse is applied before the first electrical pulse has concluded.

11. The method of claim 10, further comprising reordering the plurality of write operations for determining the overlapping sequence, wherein the reordering places the SET operation to be executed before a RESET operation.

12. The method of claim 10, wherein the next operation is another SET operation, and wherein the second electrical pulse is applied upon the first electrical pulse decaying to twenty percent of a current of the first electrical pulse.

13. The method of claim 10, wherein the next operation is a RESET operation, and wherein the second electrical pulse is applied upon the first electrical pulse decaying to twenty percent of a maximum current of the second electrical pulse.

14. The method of claim 13, further comprising terminating the first electrical pulse upon applying the second electrical pulse.

15. A method comprising:
receiving, by a control module of a storage device, a plurality of write operations for writing to a non-volatile memory device of the storage device, wherein the non-volatile memory device comprises a plurality of tiles and each of the plurality of tiles comprises memory cells;
determining, by the control module, a first subset of the plurality of write operations for writing to a first tile of the plurality of tiles;
determining, by the control module, a second subset of the plurality of write operations for writing to a second tile of the plurality of tiles; and
determining, by the control module, a first overlapping sequence for executing the plurality of write operations in the first subset and a second overlapping sequence for executing the plurality of write operations in the second subset,
wherein the plurality of write operations in at least one of the first subset and the second subset are reordered as part of determining the first overlapping sequence and the second overlapping sequence, respectively, by placing SET operations for execution before RESET operations; and
wherein the plurality of write operations in the first subset and the second subset are executed in parallel according to the first overlapping sequence and the second overlapping sequence, respectively.

16. The method of claim 15, wherein executing the SET operations comprises placing the memory cells being programmed with the SET operations in a low-resistance state.

17. The method of claim 15, wherein executing the RESET operations comprises placing the memory cells being programmed with the RESET operations in a high-resistance state.

18. The method of claim 15, wherein an amplitude of current for programing the memory cells with the SET operations is twenty percent less than the amplitude of current for programming the memory cells with the RESET operations.

19. An apparatus comprising:
means for receiving a plurality of write operations for writing to a non-volatile memory device, wherein the non-volatile memory device comprises a plurality of tiles and each of the plurality of tiles comprises memory cells;
means for determining a subset of the plurality of write operations to be written to a first tile of the plurality of tiles; and
means for reordering the subset for executing SET operations in the subset before RESET operations in the subset.

20. The apparatus of claim 19, further comprising:
means for applying a first electrical pulse to a first cell of the first tile for executing a first SET operation of the subset; and
means for applying a second electrical pulse to a second cell of the first tile for executing a second operation of the subset, wherein the second operation is either a second SET operation or a first RESET operation.

* * * * *